United States Patent [19]

Nilssen

[11] 4,184,128
[45] Jan. 15, 1980

[54] HIGH EFFICIENCY PUSH-PULL INVERTERS

[76] Inventor: Ole K. Nilssen, Ceasar Dr. Rte. 4,, Barrington, Ill. 60010

[21] Appl. No.: 890,586

[22] Filed: Mar. 20, 1978

[51] Int. Cl.$^2$ ............... H02M 1/18; H02M 7/48; H05B 41/29

[52] U.S. Cl. ............... 331/113 A; 315/97; 315/220; 315/257; 315/284; 315/DIG. 2; 363/22

[58] Field of Search ........... 331/113A; 363/22, 23; 315/97, 257, DIG. 2, 220, 284

[56] References Cited

U.S. PATENT DOCUMENTS

| | | | |
|---|---|---|---|
| 3,248,640 | 4/1966 | Wellford | 331/113 A |
| 3,323,075 | 5/1967 | Lingle | 331/113 A |
| 3,638,099 | 1/1972 | Centala | 331/113 A |
| 3,662,249 | 5/1972 | Wijsboom | 331/113 A |
| 4,042,855 | 8/1977 | Buenzli, Jr. | 331/113 A |

*Primary Examiner*—Siegfried H. Grimm
*Attorney, Agent, or Firm*—Dulin, Thienpont, Potthast, & Snyder, Ltd.

[57] ABSTRACT

High efficiency push-pull inverters minimize undesirable energy losses usually resulting from simultaneous conduction and imperfect switching of the transistor switching means. In each of the disclosed circuits, a saturable inductor and a diode are connected in parallel and across the base-emitter junction of each transistor. Voltage on the base of each transistor causes its associated saturable inductor to saturate, and the saturated inductor then terminates the flow of base current and provides a path for rapid evacuation of the charge carriers stored in the transistor base-emitter junction in order to render the transistor rapidly non-conductive. Each diode provides a drain path for current continuing to flow through its associated saturable inductor after junction evacuation. A novel triggering means initiates oscillation of the inverters. Also disclosed are feedback means operable to prevent premature transistor conduction and a capacitor connected between the collectors of the inverter transistors operable to restrain the rate of change of transistor collector voltage, both of these features also serving to minimize energy dissipation.

11 Claims, 8 Drawing Figures

HIGH EFFICIENCY PUSH-PULL INVERTERS

BACKGROUND OF THE INVENTION

1. Field of the Invention

This invention relates in general to power supply circuits, and, more particularly, to high efficiency push-pull inverter oscillator or astable multivibrator circuits.

2. Description of the Prior Art

As is well known in the art, the main function of a push-pull inverter is to convert a direct or unidirectional input voltage to an alternating voltage. In most applications of such inverters, it is important that this energy conversion be accomplished with minimal energy loss and power dissipation, primarily to avoid the size and cost disadvantages associated with sizing of components required for inefficient circuitry. Typical push-pull inverter circuits are disclosed in the following U.S. Pat. No. 3,579,026, issued May 18, 1971 to Paget; U.S. Pat. No. 3,663,994, issued May 16, 1972 to Low et al.; U.S. Pat. No. 3,691,450, issued Sept. 12, 1972 to Cox; and U.S. Pat. No. 3,913,036, issued Oct. 14, 1975 to Hook.

Of the various factors which contribute to undesirable energy loss in typical push-pull inverter oscillators, the most significant is the so-called common mode conduction, which occurs when both switching means, usually transistors, conduct simultaneously. This loss factor is the result of the inherent and unavoidable delay associated with the turn-off action of most applicable transistor switching means, which do not have a corresponding delay associated with their turn-on process. Thus, if a simple square wave current or voltage is used for actuating a pair of typical transistor switching means connected in a push-pull circuit arrangement, common mode conduction will invariably result.

The second most significant cause of energy loss is the power dissipation occurring within each transistor switching means during its turn-off transition. In order to minimize this factor, it is important to operate each transistor near its maximum switching speed capability. This maximum switching speed is attained by evacuating the stored charge carriers from the transistor base-emitter junction as rapidly as possible rather than allowing them to dissipate by recombination.

Further energy dissipation in a typical push-pull inverter results from turning on a transistor switching means, that is, rendering it conductive, prior to reduction of its collector voltage to the minimum collector voltage level. This reduction of collector voltage occurs after the other transistor switching means is rendered non-conductive.

Significant energy is also typically lost during the turn-off process of each transistor switching means when the transistor collector voltage rises significantly before the transistor has been turned completely off, that is, rendered non-conductive.

Yet another cause of significant energy loss in a typical push-pull inverter results from power dissipation within each transistor while it is conducting. In order to minimize this loss factor, it is necessary to provide adequate, but not excessive, base drive corresponding to the collector current at any given time.

SUMMARY OF THE INVENTION

The present invention provides means for minimizing the unacceptable energy losses which typically occur in prior known push-pull inverter oscillator or astable multivibrator circuits.

According to the present invention, a saturable inductor is provided for each transistor switching means and is connected across the transistor base-emitter junction. A diode is connected in parallel with each saturable inductor. Voltage on the base of each transistor for a predetermined time period saturates its associated saturable inductor which, upon saturation, rapidly terminates the flow of base current and provides a path for rapid evacuation of the charge carries stored in the transistor base-emitter junction, in order to render the transistor rapidly non-conductive.

According to another aspect of the present invention, positive feedback means for the transistor switching means are operable to provide transistor base drive current proportional to the transistor collector current, in order to prevent premature application of base drive current. Alternatively, a voltage feedback means comprises a delay means operable to prevent conduction of each transistor prior to reduction of the transistor collector voltage to its minimum level.

According to yet another aspect of the present invention, a capacitor connected between the collectors of the transistor switching means is operable to restrain the rate of change of voltage on the collectors and to provide a path for main transformer inductive current upon turn-off of the transistors.

The present invention also provides novel means for triggering the inverter circuit into oscillation.

It is therefore an important object of the present invention to provide high efficiency push-pull inverter oscillator or astable multivibrator circuits which minimize energy loss resulting from simultaneous transistor conduction, imperfect transistor switching and inadequate or excessive base drive, thereby permitting the use of relatively slow, low-cost transistors.

Yet another important object of the present invention is to provide high efficiency push-pull inverters wherein the transistor switching means are operated near their maximum switching speeds by removing or evacuating charge carriers from the transistor base-emitter junctions as rapidly as possible during the transistor turn-off process.

A further important object of the present invention is to avoid energy loss associated with premature conduction of the transistor switching means.

Yet another important object of the present invention is to minimize energy loss by preventing transistor collector voltage from rising significantly before the transistors have been rendered non-conductive.

Still another important object of the present invention is to provide adequate but not excessive base drive for the transistor switching means.

Another important object of the present invention is to provide means for triggering the inverter circuit into oscillation.

These and other objects will become apparent from the following description, which, when taken in connection with the accompanying drawings, discloses preferred embodiments of the present invention.

DESCRIPTION OF THE PREFERRED EMBODIMENTS

Figure 1:
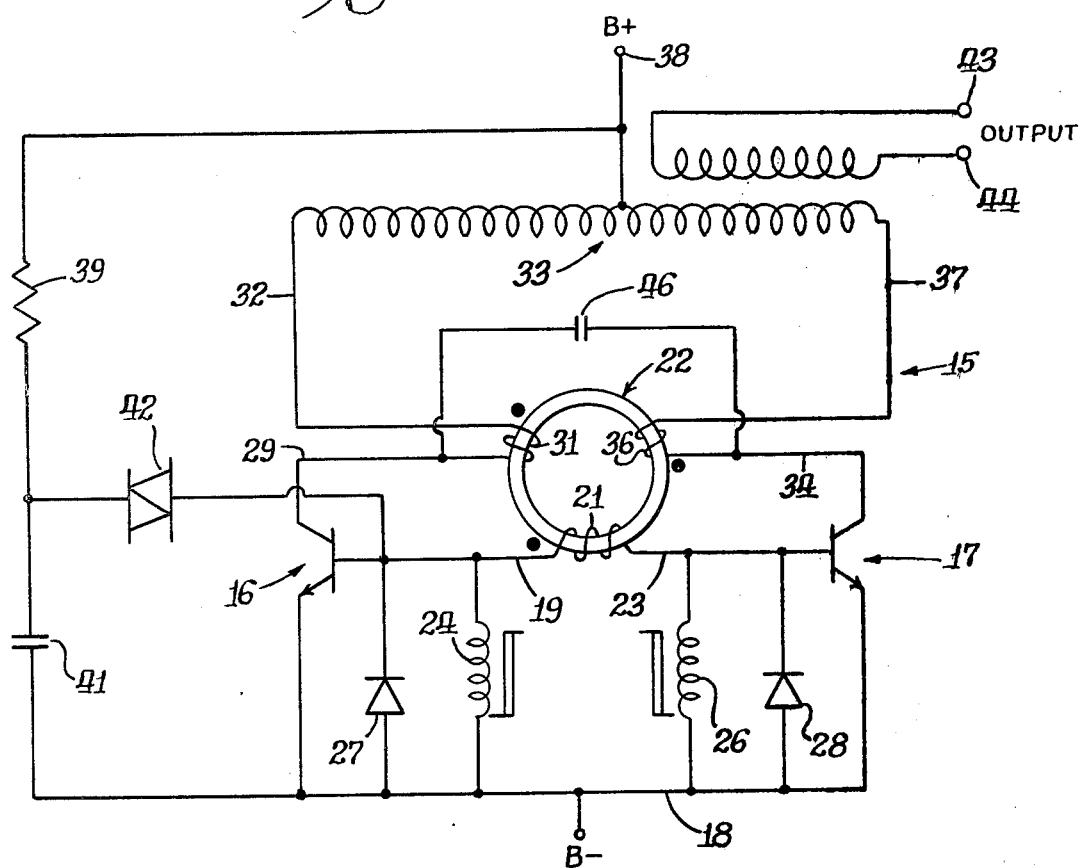
FIG. 1 is a schematic diagram of a preferred high efficiency push-pull inverter embodying the present invention.

With reference to FIG. 1, a push-pull inverter oscillator or astable multivibrator, generally indicated by reference numeral 15, comprises two alternately conducting transistor switching means 16, 17, each having a base, an emitter and a collector. The emitters are connected to a B- lead 18 of a unidirectional voltage input. The base terminal of transistor 16 is connected to a base lead or line 19 which is, in turn, connected to one end of a winding 21 on a known toroidal non-saturable current transformer 22, the other end of winding 21 being connected to a base lead 23 for transistor 17.

A pair of saturable inductors 24, 26 are connected directly across the base-emitter junctions of transistors 16, 17, and diode means 27, 28 are connected in parallel with saturable inductor means 24, 26, respectively.

A collector lead 29 for transistor 16 is connected through a winding 31 on current transformer 22 to a primary terminal 32 of a known main transformer 33. Similarly, a collector lead 34 is connected through a winding 36 on transformer 22 to the other primary lead 37 of transformer 33.

A B+ supply at 38 is connected to the center-tap of the primary of transformer 33 and, through a resistor 39 and a capacitor 41, to the B- lead 18. A Diac 42 is connected from the resistor 39 and capacitor 41 junction to the base lead 19, the Diac, in conjunction with this resistor and capacitor, serving to provide trigger pulses to initiate oscillation of the inverter circuit 15. Once the circuit 15 is triggered into oscillation, the triggering pulses have a negligible effect on the circuit and the transistors 16, 17 alternately conduct in a well-known manner to provide an alternating voltage to the primary of transformer 33, resulting in an substantially square wave voltage on secondary terminals 43, 44 of transformer 33. The transformer 33 has some leakage inductance and in order for oscillation to be sustained, it is necessary that enough inductive energy be stored periodically in the main transformer 33 because there is no D.C. bias to re-trigger oscillation after each half-cycle. A capacitor 46 is connected between the collector leads 29 and 34.

In the operation of the inverter circuit 15, considering typical transistor 16, this transistor will remain conductive for as long as base current is provided to its base lead 19 and, further, until stored charge carriers are removed from its base-emitter junction. Voltage on the base lead 19 of transistor 16 for a time period determined by the saturation characteristics of the saturable inductor 24 causes this inductor to saturate. Upon saturation of inductor 24, current will discontinue flowing into the base of transistor 16. In addition, since a saturated inductor effectively constitutes a short circuit for current flowing in one direction, the charge carriers stored in the base-emitter junction of transistor 16 are rapidly evacuated through the path then provided by the saturated inductor 24, in order to render transistor 16 abruptly and rapidly non-conductive. Because the saturable inductors 24, 26 are connected directly across the base-emitter junctions of their associated transistors, the junction discharge current flows through low resistance paths which avoid the intervening impedances of biasing means. The rapid evacuation of the base-emitter junction charge carries occurs in a time period much shorter than the time required for the natural recombination process, which would have resulted in a substantial turn-off delay and a gradual turn-off of transistor 16.

When transistor 16 turns off, the voltage on its collector will rise. However, due to the capacitor 46 connected between collector leads 29 and 34, the rate of rise of collector voltage is restrained. As a result, transistor 16 is turned off or rendered non-conductive before its collector voltage has had a chance to rise significantly, avoiding energy dissipation during the transistor turn-off process. Capacitor 46 is essential when using commonly available components, but the use of extremely saturable magnetic material for inductor means 24, 26 will obviate the necessity for the inclusion of this capacitor in the circuit. Alternatively, a capacitor (not shown) may be connected between the collector and emitter terminals of each transistor 16, 17.

The flow of stored charge carriers from the base-emitter junction of transistor 16 through the saturable inductor 24 constitutes a current. Even if saturated, the inductor 24 will have at least a small amount of residual inductance and, as a result, as soon as the base of transistor 16 is empty of charge carriers, current will continue through inductor 24 for a short period of time. Accordingly, diode 27 prevents excessive reverse voltage on the base of transistor 16 and provides a path for this briefly continuing inductive current.

Diode 27 also provides a path for forward current into the base of its non-associated transistor 17. Positive current feedback is supplied by the non-saturable current transformer 22 which, by means of its windings 31, 36 and 21, provides base drive current to transistors 16, 17 which is proportional to the transistor collector current, thereby assuring adequate base drive without causing excessive drive when the transistor collector current is low. The periodic reversal of voltage on each saturable inductor 24, 26 causes its core to be reset.

Capacitor 46 provides a path for main transformer primary inductive current upon turn-off of each of the transistors 16, 17. Considering typical transistor 16, when this transistor is conductive, an amount of inductive current accumulates in the leakage inductance of the main transformer 33, apart from any load current that might have been flowing. As transistor 16 is turned off rapidly, this inductive current will continue to flow. At first, it will simply flow into the capacitor 46 connected between the collectors. But after the voltage on collector 29 has reached twice the value of the B+ supply, requiring that the voltage on the collector 34 for transistor 17 has dropped to zero, this inductive current will flow from the B- lead 18, through diode 28, the base-collector junction of transistor 17 and through the main transformer 33 to the B+ lead 38. Thus, energy associated with the leakage current that had accumulated during the on period of transistor 16 is forced back into the B+ supply. In order to insure stable oscillation as well as to minimize energy dissipation, it is necessary that the leakage inductance of the main transformer 33 be large enough to insure complete reversal of the collector voltages without utilizing the transistors 16, 17 for forcing this reversing process.

In an inverter circuit 15 adapted to provide about 75 watts of power to a load, the power dissipation in each of the switching transistors 16, 17 amounts to only approximately 0.25 watts, which eliminates the need for a separate heat sink.

Figure 2:
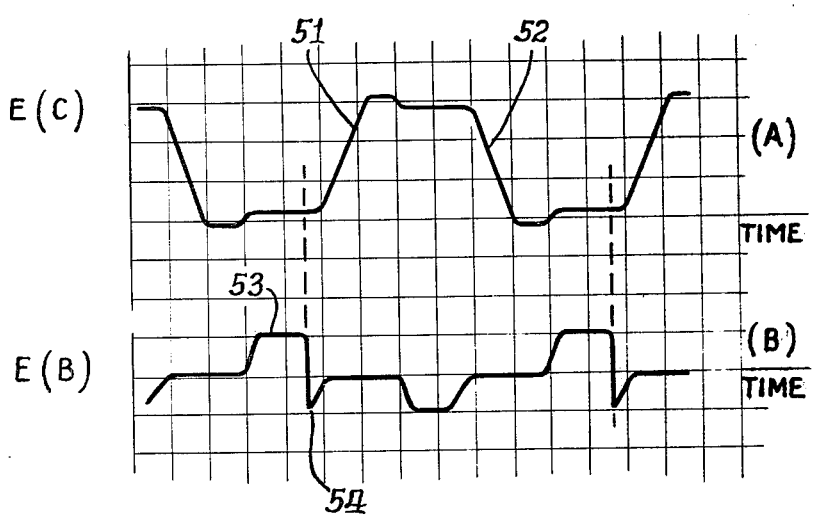
FIG. 2 illustrates at (A) and (B) typical diagrams of the waveforms of the collector and base voltages, respectively, for one of the transistors in the circuit of FIG. 1.

The typical collector and base voltages, conventionally designated E(C) and E(B), for one of the transistors in inverter circuit 15 are diagramatically illustrated in FIGS. 2(A) and (B), respectively. As shown in FIG. 2(A), the rate of rise and fall of collector voltage is restrained, as indicated by reference numerals 51, 52, respectively. The transistor base voltage becomes positive, as indicated by reference numeral 53 in FIG. 2(B), at about the same time when reverse current (not illustrated) has terminated through the transistor. As indicated by reference numeral 54, the base voltage is abruptly reduced to zero upon saturation of a saturable inductor, which causes evacuation of the charge carriers stored in the base-emitter junction during a time period much shorter than the time required for natural recombination.

Figure 3:
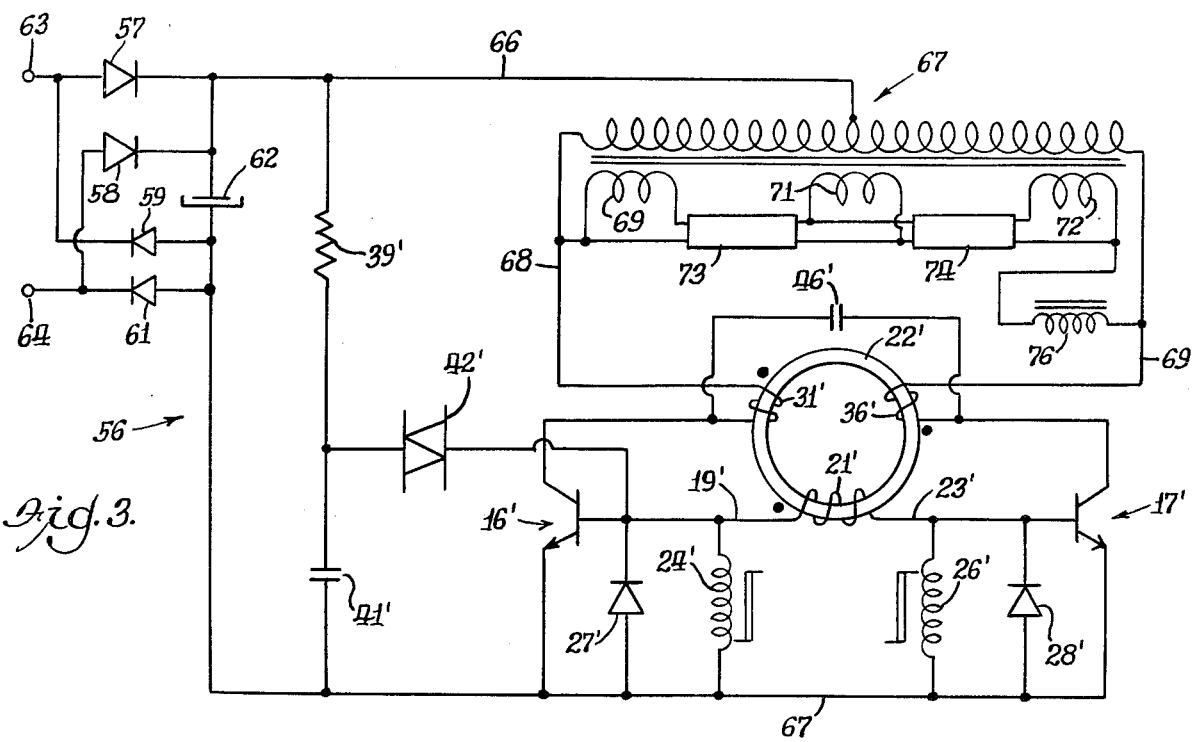
FIGS. 3 and 4 schematically illustrate further embodiments of the present invention utilized in connection with high efficiency ballast circuits for fluorescent lamps.

A main application of the present invention is in a high efficiency ballast circuit for fluorescent lamps. Such a circuit, generally designated by reference numeral 56, is illustrated in FIG. 3. As shown in that figure, a bridge rectifier comprising diodes 57, 58, 59 and 61 and an electrolytic capacitor 62 convert an alternating current at terminals 63, 64 to a filtered direct current applied to a B+ lead 66 and a B− lead 67. The B+ lead is connected to the center-tap of a primary winding of a main transformer 67, the primary winding having leads 68, 69 which correspond to leads 32 and 37 in the inverter circuit 15 of FIG. 1. Secondary windings 69, 71 and 72 provide the filament supply to the four separate filaments that require heating in a ballast circuit for two fluorescent lamps 73, 74, which are connected to lead 68 and, through a ballast inductor 76, to lead 69. In all other respects, the operation of circuit 56 of FIG. 3 is identical to that of inverter circuit 15 of FIG. 1, and the corresponding elements in FIG. 3 are denoted by primed reference numerals.

Figure 4:
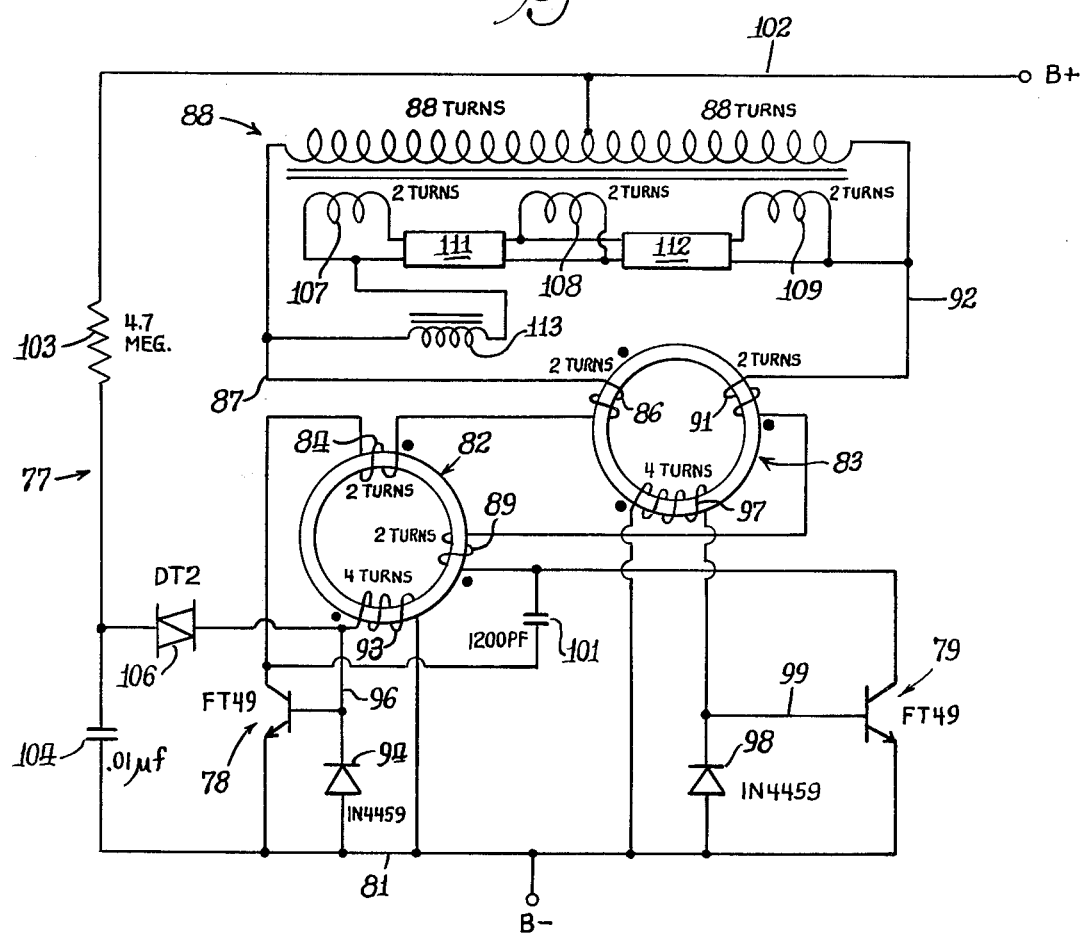

FIG. 4 illustrates an alternate preferred embodiment of the present invention comprising an inverter oscillator circuit, generally indicated by reference numeral 77, also employed in a high efficiency ballast circuit for fluorescent lamps. It will be recognized that the component values and types shown in FIG. 4 are typical, the component selection being a matter of design choice determined by the particular circuit application. The preferred values indicated in FIG. 4 are employed in a circuit operable to power two 40 watt 48 inch fluorescent lamps of the "rapid start" type.

In circuit 77, a pair of alternately conducting transistor switching means 78, 79 have emitter terminals transistor switching means 78, 79 have emitter terminals connected to a B− lead 81. Instead of employing two saturable inductors and a non-saturable transformer (components 24, 26 and 22 in FIG. 1), circuit 77 utilizes two toroidal core saturable transformers 82, 83. The collector of transistor 78 is connected through a winding 84 on transformer 82 and a winding 86 on transformer 83 to a primary lead 87 of a main transformer generally designated by reference numeral 88. Similarly, the collector of transistor 79 is connected through a winding 89 on transformer 82 and a winding 91 on transformer 83 to the other primary lead 92 of transformer 88. A winding 93 on transformer 82 is connected in parallel with a diode 94 from a base lead 96 of transistor 78 to the B− lead 81. Similarly, a winding 97 on transformer 83 is connected in parallel with a diode 98 from a base lead 99 on transistor 79 to the B− lead 81. A capacitor 101 is connected between the collectors of transistors 78 and 79.

A B+ lead 102 is connected through a resistor 103 and a capacitor 104 to the B− lead 81, and a Diac 106 is connected from the junction of this resistor and capacitor to the base lead 96 in order to provide triggering pulses required to initiate oscillation and alternate conduction of the transistors 78 and 79. The B+ lead 102 is also connected to the center-tap of the primary winding of transformer 88. Transformer 88 comprises secondary windings 107, 108 and 109 for heating the filaments of fluorescent lamps 111, 112, which are connected in series and to primary lead 87 through a ballast inductor 113.

The windings 93, 97 for transistors 78, 79 of circuit 77 comprise saturable inductor means identical in function to inductors 24, 26, respectively, utilized in circuit 15 of FIG. 1. The saturable transformers 82, 83 also provide base drive current for each of the transistors 78, 79 proportional to the collector current thereof in order to prevent premature application of base drive current. The use of two saturable transformers instead of just one isolates the transistor bases; without this isolation, junction discharge current from a transistor would tend to briefly turn on the other transistor. The general operation of circuit 77 is identical to the operation of the previously described currents.

It should be emphasized that for the saturable inductors or transformers to be effective in the disclosed circuits, it is important that these components be made as small as reasonably possible. The saturable inductors utilized in circuit 77 comprise ferrite toroidal cores that are preferably 0.15 inch in diameter.

Figure 5:
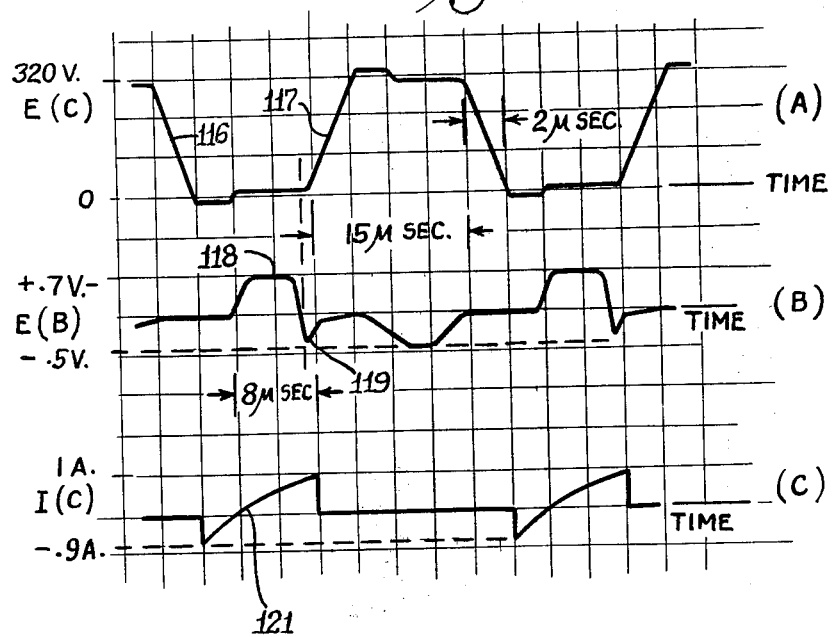
FIG. 5 illustrates at (A), (B) and (C) typical waveform diagrams of the collector voltage, the base voltage and the collector current, respectively, for one of the transistors in the circuit illustrated in FIG. 4.

FIGS. 5(A), (B) and (C) illustrate the typical waveforms for the collector voltage E(C), the base voltage E(B) and the collector current I(C), respectively, for one of the transistors of FIG. 4, assuming a B+voltage of 160 volts, which is conveniently derived from a well-known full wave bridge rectifier (similar to that shown in FIG. 3) connected to a 120 volt, 60 Hz. conventional power supply. As shown in FIG. 5(A), the rates of change of collector voltage are restrained, as indicated by reference numerals 116 and 117. The base voltage, indicated by reference numeral 118, becomes positive when the reverse collector current is terminated, as designated by reference numeral 121 in FIG. 5(C). The base voltage is rapidly reduced to zero, as indicated by reference numeral 119, upon saturation of a saturable inductor, as previously described. After the base drive terminates, the collector voltage rises and the collector current reduces to zero.

Figure 6:
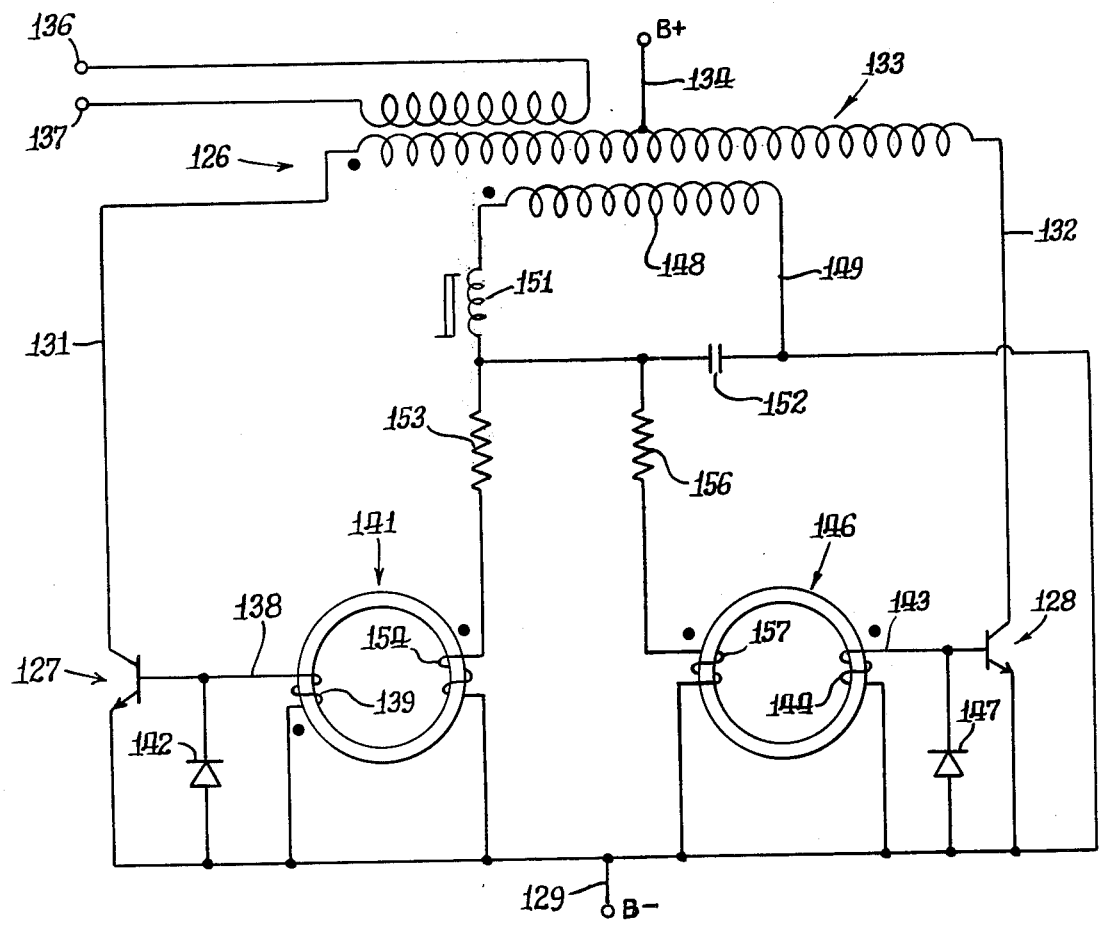
FIGS. 6, 7 and 8 are circuit diagrams of additional preferred embodiments of the present invention.

FIG. 6 illustrates another preferred embodiment 126 of the present invention wherein the feedback is provided by means of a separate winding on the main transformer. In this illustration, the triggering circuitry, which has been previously described, has been omitted for simplification.

A pair of transistors 127, 128 have emitter terminals connected to a B− lead 129 and collectors connected to primary leads 131, 132, respectively, of a main transformer 133, which has a primary winding connected to a B+ lead 134 at its center-tap. The circuit 126 is operable to provide, at output terminals 136, 137 connected to a secondary winding of main transformer 133, a square wave voltage output. A base lead 138 of transistor 127 is connected to the B— lead 129 through a winding 139 on a toroidal core saturable transformer 141, a diode 142, being connected in parallel with winding 139. Similarly, a base lead 143 of transistor 128 is connected to the B— lead 129 through a winding 144 on a toroidal core saturable transformer 146, a diode 147 being connected in parallel with winding 144.

A separate winding 148 on the main transformer 133 has a first lead 149 connected to the B— lead 129. Winding 148 has a second lead connected to a saturable inductor 151, which is, in turn, connected to lead 149 through a capacitor 152. Saturable inductor 151 is connected to the B— lead 129 through a resistor 153 in series with a winding 154 on transformer 141. Inductor 151 is also connected to the B— lead through a resistor 156 in series with a winding 157 on transformer 146. The winding 148 provides a voltage feedback source rather than a current source utilized in the previously described circuits. When feedback is provided in the form of a voltage, it is important to prevent the feedback voltage from turning on a transistor before the transistor collector voltage has fallen to the B— or minimum level. As previously discussed, the collector voltage will drop to the B— level due to the leakage inductance in the main transformer. If the base is turned on before the collector voltage has fallen to its minimum or B— level, unnecessary dissipation will occur in the transistor. Accordingly, a delay means comprising the inductor 151 and the capacitor 152 prevent the premature application of feedback voltage.

Once the circuit 126 has been triggered into oscillation, the operation, described in conjunction with typical transistor 127 is as follows. When transistor 127 is conductive, it will remain so for as long as the saturable inductance comprising winding 139 remains unsaturated. When that inductance saturates, the base current into transistor 127 reverses and the stored charge carriers are evacuated from the base-emitter junction of that transistor. At some later time, as the voltage across the main transformer 133 reverses, as does the feedback voltage on winding 148, the saturable inductor 151 in combination with the capacitor 152 prevents the reverse voltage from being applied to the base lead 143 of transistor 128 immediately, thereby preventing that transistor from being rendered conductive before its collector voltage has reached zero. Moreover, capacitor 152 serves to isolate the saturable inductors comprising windings 139 and 144 from one another, thereby preventing dissipative interaction between the two transistors.

Figure 7:
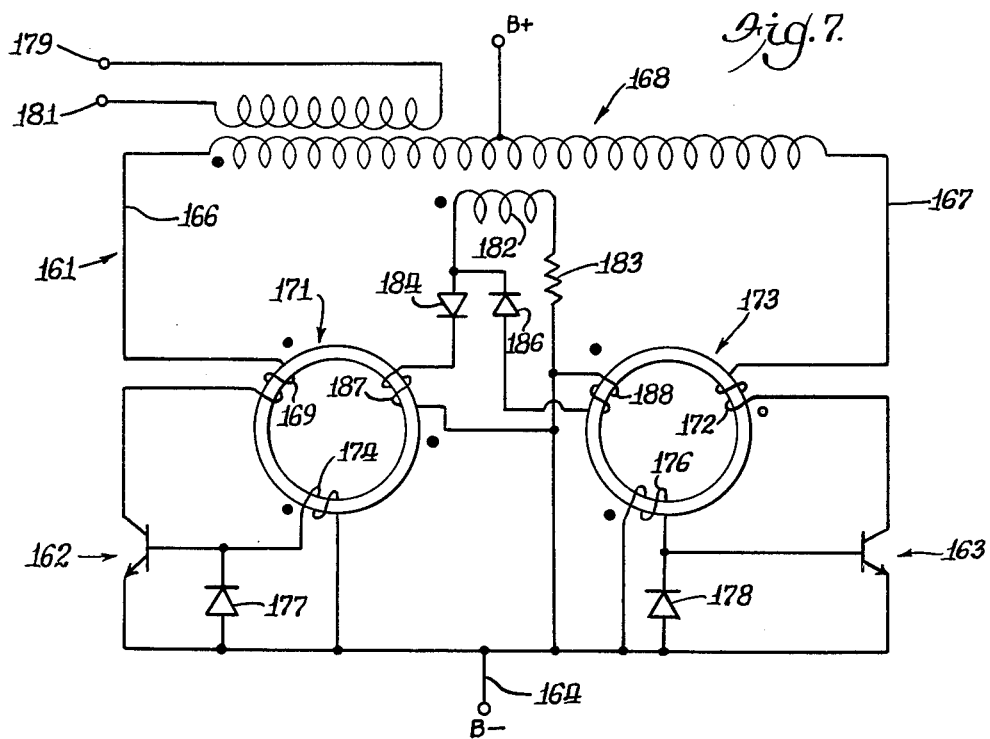

FIG. 7 illustrates another embodiment of the present invention wherein the forward feedback is accomplished by current transformer operation, in a manner similar to that of circuit 15 of FIG. 1, but the periodic resetting of each saturable inductor is accomplished by way of voltage feedback. Again, the triggering circuitry for initiation of oscillation has been omitted for simplification.

In the circuit 161 shown in FIG. 7, which is similar in operation to the circuit 126 of FIG. 6, a pair of alternately conducting transistors 162, 163 have emitters connected to a B— lead 164. Transistors 162, 163 have collectors connected to primary winding leads 166, 167 of a main transformer 168 through a winding 169 on a toroidal core saturable transformer 171 and a winding 172 on a similar transformer 173, respectively. The base of transistor 162 is connected to the B— lead 164 through a winding 174 on transformer 171; similarly, the base lead of transistor 163 is connected to the B— lead 164 through a winding 176 on transformer 173. Diodes 177, 178 are connected across the base-emitter junctions of transistors 162, 163, respectively. The main transformer 168 comprises a secondary winding to provide a substantially square wave voltage output at output terminals 179, 181.

The main transformer 168 further comprises a separate voltage feedback winding 182 having one side thereof connected to the B— terminal 164 through a current-limiting resistor 183. The other side of the winding 182 is connected to opposing diodes 184, 186 which serve the purpose of preventing positive or forward feedback. Diode 184 is in turn connected to the B— lead through a winding 186 on transformer 171 and diode 186 is in turn connected to the B— lead through a winding 188 on transformer 173. Since the power required to reset the saturable inductors is very small, and because it takes no power at all to keep the transistors 162, 163 non-conductive, the resetting of the cores of the transformers 171, 173 can be readily accomplished without creating significant circuit transients. However, to prevent spurious turn-on action during a non-conductive period, there must be some power behind the reset function.

The problem associated with the storage time of the carriers in the transistor base-emitter junctions is particularly acute in transistors designed for high voltage operation. For example, in the transistors typically used in the circuits disclosed, the storage time may be anywhere from 1 to 5 microseconds in transistors rated at more than 150 volts on the collector. Moreover, this storage time is highly variable, making it particularly difficult to provide proper compensation by conventional means. However, in the circuits disclosed herein, the compensation is automatically provided because one transistor does not turn on until the other transistor is correspondingly turned off, and vice versa. Furthermore, the turn off action in the disclosed circuits is abrupt, thereby avoiding the lingering effects of the otherwise slowly recombining base-emitter current carriers.

Figure 8:
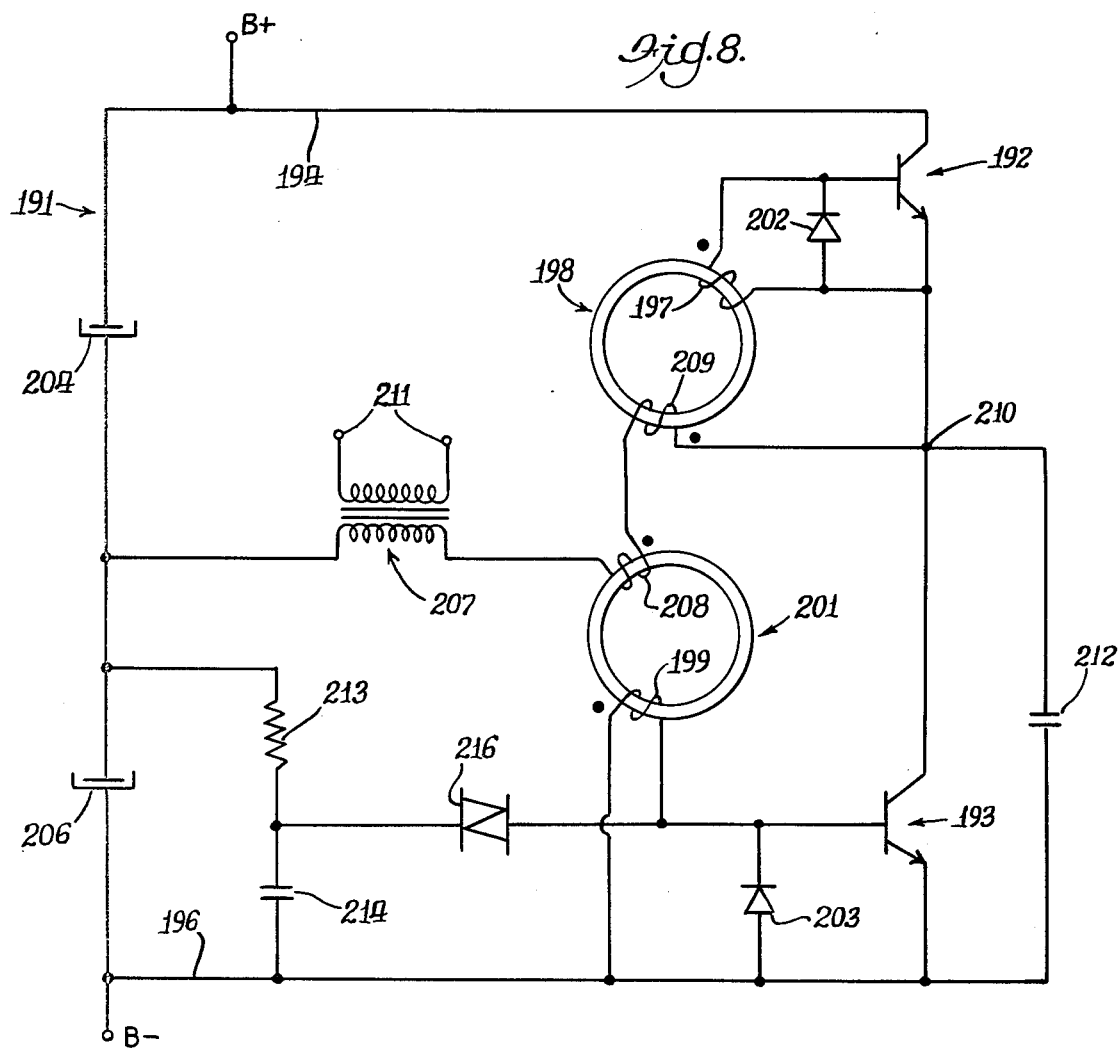

FIG. 8 illustrates another embodiment of the present invention wherein the transistors are connected in series, as is often necessary when the B+ voltage is very high. In that figure, an inverter circuit 191 comprises a pair of alternately conducting transistor switching means 192, 193 connected in series between a B+ lead 194 and a B— lead 196 of a unidirectional voltage source. A winding 197 on a toroidal saturable transformer 198 is connected between the base and emitter terminals of transistor 192 and a similar winding 199 on a transformer 201 is connected between the base and emitter terminals of transistor 193. Diodes 202, 203 are connected across the base-emitter junctions of transistors 192, 193, respectively. A pair of electrolytic capacitors 204, 206 are connected in series between the B+ terminal 194 and the B— terminal 196. The junction of those capacitors is connected through the primary winding of a transformer 207, a winding 208 on transformer 201 and a winding 209 on transformer 198 to a junction 210 between transistors 192 and 193. Transformer 207 comprises a secondary winding to provide a substantially square wave output at terminals 211. A capacitor 212 is connected between junction 210 and the B— lead 196. In parallel with electrolytic capacitor 206 are connected a resistor 213 and a capacitor 214. A Diac 216 is connected between the junction of this resistor and capacitor and the base terminal of transistor 193. The combination of resistor 213, capacitor 214 and Diac 216 comprises the triggering means operable to initiate alternate conduction of transistors 192, 193.

It is thought that the invention and many of its attendant advantages will be understood from the foregoing description, and it is apparent that various changes may be made in the form, construction and arrangement of its component parts without departing from the spirit and scope of the invention or sacrificing all of its material advantages, the forms described being merely preferred embodiments thereof.

The embodiments of the invention in which an exclusive property or privilege is claimed are defined as follows:

1. In a push-pull inverter circuit connected to a unidirectional voltage input and being operable to provide an alternating voltage output, the inverter circuit comprising a main transformer in circuit with two alternately conducting transistor switching means, each having a base, an emitter and a collector, the improvement which comprises:
   separate saturable inductor means that are non-coupled for each said transistor switching means and being connected directly across the base-emitter junction thereof; and
   diode means connected in parallel with each said saturable inductor means;
   whereby voltage on the base of each said transistor switching means for a predetermined time period serves to saturate the respective saturable inductor means associated therewith;
   each said saturable inductor means being operable, when saturated, to terminate the flow of base current for its associated transistor switching means and to provide a path for rapid evacuation of charge carriers stored in the base-emitter junction of said associated transistor switching means to render the latter rapidly non-conductive;
   each said diode means serving to provide a drain path for current continuing to flow through its associated saturable inductor means upon said evacuation of charge carriers by the latter.

2. The inverter circuit of claim 1, and positive feedback means comprising a current transformer for said transistor switching means and being operable to provide base drive current for said transistor switching means proportional to the collector current thereof.

3. The inverter circuit of claim 1, and voltage feedback means for said transistor switching means, said voltage feedback means comprising a delay means operable to prevent conduction of said transistor switching means prior to the reduction of the collector voltage thereof to the minimum collector voltage level.

4. The inverter circuit of claim 3, wherein said delay means comprises a saturable inductor and a capacitor.

5. The inverter circuit of claim 1, wherein each of said saturable inductor means is combined with a current feedback means for providing base drive current for an associated transistor switching means proportional to the collector current thereof.

6. The inverter circuit of claim 1, and positive current feedback means comprising a saturable transformer means for each transistor switching means, each said feedback means being operable to provide base drive current for its associated transistor switching means proportional to the collector current thereof, and resetting means for said saturable transformer means, and resetting means being operable to provide therefor periodic reset voltage derived from the voltage of the main transformer.

7. The inverter circuit of claim 1, wherein said transistor switching means are connected in series across the unidirectional voltage input.

8. The inverter circuit of claim 2, and a capacitor connected directly between the collectors of said transistor switching means, said capacitor being operable to restrain the rate of change of voltage on the collectors.

9. The inverter circuit of claim 2, and triggering means for initiating alternate conduction of said transistor switching means, the main transformer being operable periodically to supply from its leakage inductance stored inductive energy to said transistor switching means to sustain alternate conduction thereof.

10. The inverter circuit of claim 9, and a capacitor connected directly between the collectors of said transistor switching means, said capacitor being operable to restrain the rate of change of voltage on the collectors and to provide a path for main transformer inductive current upon turn-off of said transistor switching means.

11. In a push-pull inverter circuit connected to a unidirectional voltage input and being operable to provide an alternating voltage output, the inverter circuit comprising a main transformer in circuit with two alternately conducting transistor switching means, each having a base, an emitter and a collector, the improvement which comprises:
    separate saturable inductor means that are non-coupled for each said transistor switching means and being connected directly across the base-emitter junction thereof;
    diode means connected in parallel with each said saturable inductor means;
    positive feedback means comprising a current transformer means connected to said transistor switching means;
    a capacitor connected directly between the collectors of said transistor switching means; and
    triggering means in circuit with the unidirectional voltage input and said transistor switching means for initiating alternate conduction thereof, the main transformer being operable periodically to supply from its leakage inductance stored inductive energy to said transistor switching means in order to sustain alternate conduction thereof;
    whereby voltage on the base of each said transistor switching means for a predetermined time period serves to saturate the respective saturable inductor means associated therewith;
    each said saturable inductor means being operable, when saturated, to terminate the flow of base current for its associated transistor switching means and to provide a low resistance path for rapid evacuation of charge carriers stored in the base-emitter junction of said associated transistor switching means to render the latter rapidly non-conductive;
    said positive feedback means being operable to provide base drive current for said transistor switching means proportional to the collector current thereof whereby to prevent premature application of base drive current;

each said diode means serving to provide a drain path for current continuing to flow through its associated saturable inductor means upon evacuation of charge carriers by the latter;

said capacitor being operable to restrain the rate of change of voltage on the collectors and to provide a path for main transformer inductive current upon turn-off of said transistor switching means.

* * * * *